US007529069B1

(12) United States Patent
Weems, II et al.

(10) Patent No.: US 7,529,069 B1
(45) Date of Patent: May 5, 2009

(54) APPARATUS AND METHOD FOR GROUND FAULT DETECTION AND LOCATION IN ELECTRICAL SYSTEMS

(76) Inventors: Warren A. Weems, II, 10935 W. Laurelwood Land, Avondale, AZ (US) 85323; Russell L. Kincaid, 395 Savage Rd., Milford, NH (US) 03055; Wayne L. Green, 4901 W. Hackamore Dr., Glendale, AZ (US) 85310

( * ) Notice: Subject to any disclaimer, the term of this patent is extended or adjusted under 35 U.S.C. 154(b) by 0 days.

(21) Appl. No.: 11/504,095

(22) Filed: Aug. 10, 2006

Related U.S. Application Data

(63) Continuation-in-part of application No. 10/709,146, filed on Apr. 16, 2004, now abandoned, which is a continuation-in-part of application No. 10/215,310, filed on Aug. 8, 2002, now Pat. No. 6,844,736.

(51) Int. Cl.
    *H02H 3/00* (2006.01)
(52) U.S. Cl. ...................................................... 361/42
(58) Field of Classification Search .................... 361/42
    See application file for complete search history.

(56) References Cited

U.S. PATENT DOCUMENTS

| 4,837,519 | A | * | 6/1989 | Lopetrone et al. | ............ | 324/529 |
| 4,884,034 | A | * | 11/1989 | Guzman | ...................... | 324/529 |
| 5,363,047 | A | * | 11/1994 | Dresti et al. | ................. | 324/510 |
| 5,448,491 | A | * | 9/1995 | Janke et al. | ..................... | 702/58 |
| 6,249,230 | B1 | * | 6/2001 | Baldwin et al. | ............. | 340/650 |
| 7,136,265 | B2 | * | 11/2006 | Wong et al. | .................... | 361/42 |
| 2005/0083616 | A1 | * | 4/2005 | Reid et al. | ..................... | 361/42 |

* cited by examiner

*Primary Examiner*—Stephen W Jackson
*Assistant Examiner*—Scott Bauer
(74) *Attorney, Agent, or Firm*—Wright Law Group, PLLC; Mark F. Wright

(57) ABSTRACT

The present invention is implemented by deploying an enhanced ground fault detection and location apparatus and by using the apparatus in conjunction with specific circuit analysis methods, using the information generated by the ground fault detection and location apparatus. The ground fault detection and location apparatus comprises the functionality of a voltmeter, an ammeter, a frequency generator, and a variable power supply, thereby providing for a variety of signals and analyses to be performed on a unintentionally grounded circuit in an ungrounded AC or DC power distribution system. The apparatus includes a main unit and a remote unit, which may be a portable hand-held unit. In a first mode, the apparatus of the present invention can be used to detect ground faults. By switching to a second mode, the apparatus of the present invention can be used to locate ground faults. The methods of the present invention involve the generation of various signals by the main ground fault detection and location unit. The generated signals are introduced into the electrical distribution system and monitored by various means, including one or more remote units. By analyzing the system-level response to the generated signals, the specific location of the ground fault or faults can be more readily ascertained, thereby promoting rapid and efficient repair and recovery practices. The apparatus of the present invention may be implemented as a dedicated, permanent installation or as a temporary portable system. Additionally, the system may be implemented as an automatic computer-controlled ground fault location and detection system.

18 Claims, 7 Drawing Sheets

APPARATUS AND METHOD FOR GROUND FAULT DETECTION AND LOCATION IN ELECTRICAL SYSTEMS

RELATED APPLICATIONS

This application is a continuation-in-part of U.S. patent application Ser. No. 10/709,146 filed on Apr. 16, 2004, which application is now abandoned, which application is a continuation-in-part of U.S. patent application Ser. No. 10/215,310 filed on Aug. 8, 2002, which application is now issued as U.S. Pat. No. 6,844,736, all of which are incorporated herein by reference.

BACKGROUND OF THE INVENTION

1. Field of the Invention

The present invention relates to systems and methods for detecting and locating ground faults in electrical distribution systems. More particularly, the present invention relates to systems and methods for detecting and locating ground faults in ungrounded AC or DC system without de-energizing the circuit.

2. Background Art

An electric circuit provides a path for electric current to travel that is typically composed of conductors, conducting devices, and a source of electromotive force that drives the current around the circuit. Current flows in an electric circuit in accordance with several definitive laws, including Ohm's law, which provides that the amount of current flowing in a circuit made up of pure resistances is directly proportional to the electromotive force impressed on the circuit and inversely proportional to the total resistance of the circuit. Ohm's law applies to circuits for both direct current ("DC") and alternating current ("AC"), but additional principles, such as Thevinin's theorem, must be invoked for the analysis of complex network circuits and for AC circuits also involving inductances and capacitances.

An electric circuit may include an intentional electrical connection from a conductor to an electrical ground termed "a grounded system" or a circuit may be intentionally left ungrounded. Such ungrounded systems typically contain a ground detection device that is intentionally grounded through a resistance in the detector. This ground path only serves to provide a reference to ground from either the positive conductor or the negative conductor and should not be confused with a grounded system. In an industrial setting, such as power plants and manufacturing plants, ungrounded electrical systems usually supply many field devices such as vital loads that must remain invulnerable to spurious trips such as certain plant control functions, valve actuators, emergency equipment etc. An electrical ground is an electrically conductive body, such as the earth, which maintains a zero potential (i.e., it is not positively nor negatively charged). An electrical connection to a ground carries current away from the circuit.

Occasionally, on an intentionally ungrounded circuit, a ground fault may occur. When this happens the ungrounded circuit (unlike an intentionally grounded circuit) is designed to continue to feed the load. Undesirable ground faults on ungrounded systems can result from many several different situations. For example, some of the major failures in electric equipment are caused by insulation breakdowns. The insulation is affected by aging, humidity, dust and environmental conditions, operational parameters and maintenance or clean up practices. Over time, the insulation can degrade, thereby exposing the conductors to other conducting materials, resulting in an unintentional grounding. Other types of failures that may introduce ground faults include circuit board failures, excess moisture, bad wire joints and sleeves, leaking batteries, accidental grounds caused during testing, component failure, etc.

Additionally, there may be multiple ground faults on either the positive circuit leg ("hot side" for AC) or negative circuit leg ("common side" for AC) of a DC electrical distribution system or on both circuit legs at the same time. A DC electrical distribution system may have multiple branch circuits and each branch circuit may have many components being fed by the electrical distribution system. Ground faults are typically classified in one of two ways, as a "hard" ground fault or as a "soft" ground fault. A hard ground fault is a ground fault that offers little or no resistance to current flow. A soft ground fault is a ground fault that offers at least more than minimal resistance to current flow. In most electrical distribution systems, any ground that results in a detectable current flow in any monitored component will cause the actuation of a ground fault detection device (typically located at the main distribution bus), thereby alerting the operators of the electrical distribution systems to the presence of the ground fault. Once detected, the ground fault should be located and eliminated. A typical ground fault detection circuit consists of a pair of center-tapped resistors and the use of such standard ground fault detectors in electrical distribution systems is well-known to those skilled in the art and, accordingly, is not discussed in greater detail herein.

The existence of a single ground fault in a given system, while significant, is not as problematic as the occurrence of a second ground fault on the same system. Should a second ground occur prior to the first ground fault being located and repaired, the electrical distribution system could be seriously compromised. In this situation, extreme fault current may develop on the electrical distribution system with a possible complete de-energization of vital circuit(s) resulting. This is why it is of utmost importance to detect, locate, and repair a first ground fault at the earliest possible time, and most preferably before a second ground fault occurs on the same electrical distribution system. With multiple simultaneous ground faults, unexpected shutdowns of electrical equipment may occur, with the sudden operational failure affecting not only the operation of the equipment connected to the electrical distribution system, but possibly halting critical and related production systems and possibly resulting in serious equipment damage, hazards to personnel, and extended electrical system outages with longer repair times.

As demonstrated by the discussion above, ground fault detection is a very important consideration in ungrounded electrical distribution systems. However, equally important and far more difficult is ground fault location. A ground detection system only senses that a ground fault exists somewhere on what may be a vast ungrounded electrical system while pinpointing the exact location of the ground fault is a task that remains to be accomplished.

Techniques currently exist that enable the detection of a ground fault on an ungrounded system. For example, ground fault detectors (e.g. ANSI device function number 64) are available that sense that a ground fault exists somewhere on a vast ungrounded electrical system. Such fixed ground-detecting equipment is typically used to detect and indicate the presence of a ground fault on a large distribution system. Once the ground is detected, an alarm will sound at the larger or higher-level distribution switchgear indicating a ground fault has occurred on the system. Some contemporary ground detection devices allow multiple alarm set points that are initiated at various levels, depending on factors such as the amount of impedance or resistance associated with the ground fault.

These devices will typically activate a primary alarm at a localized switchgear location when a ground fault reaches a specific magnitude. As the ground fault reaches a stronger magnitude, a secondary alarm will occur typically in an industrial plant's control room indicating a more urgent need to locate the fault. Once again, these cascading alarm systems are useful for indicating the presence of a ground fault without providing any location information that may be used to remedy or eliminate the ground fault. Thus, while techniques currently exist that will alert a user that a ground is somewhere on the system, it cannot accurately identify on which branch circuit the ground is located. In addition, depending on the amount of personnel located near the alarm system, a localized alarm may go unnoticed and the ground fault undetected until a second ground fault occurs, leaving vital systems at risk.

Techniques, independent of ground detectors, are also available to perform ground fault location, which is the act of finding the source of the ground. These various methods and techniques generally employ a standard current transformer and a method to vary the current flow in some fashion. However, a typical current transformer will only provide an output when monitoring a rising and falling current flow. Accordingly, on a DC circuit, a current transformer will not provide a measurable output unless the current is manipulated in some fashion.

Portable ground fault locating techniques used on uninterruptible systems supplying vital loads typically attempt to locate the circuit containing the ground fault by causing the ground fault current to vary in magnitude, thereby providing a signal that can be detected. A current transformer is then used as a detector to sense associated ground fault current changes, systematically on every circuit of the system, until the circuit containing the ground fault is located. While effective in certain limited circumstances, given the possibility of hundreds of circuits that may need to be checked, this technique can be very time-consuming and labor intensive. Additionally, there are a number of other limiting factors that make present techniques less than optimal.

For example, many high resistance ground faults have very low levels of current flowing in them, making the use of a standard current transformer practically useless in a ground fault detection scenario. If the ground fault current is very low, the current transformer will not have an output of any measurable size and the circuit with the ground fault cannot be located. Additionally, many circuits suffer from higher frequency "noise" in the circuit, with the possibility of eliciting a false positive result for most techniques used to locate ground faults. Additionally if an amount of normally detectable ground fault current is available but yet lower in magnitude than the noise on the electrical distribution system, traditional ground fault location equipment will not be able to distinguish between the actual ground fault and the ambient noise on the circuit and the result will be an inability to locate the circuit containing the ground fault. As explained herein, traditional ground fault locating equipment may be incapable of detecting high resistance ground faults due to either a low amount of ground fault current, excessive noise on the system, or a combination of both.

In these relatively common situations, the only other commonly known method employed to locate the circuit containing the soft ground fault is the "breaker isolation" method. In this method the technician must systematically open each branch circuit starting with the one offering the least risk to vital equipment, gradually moving up to ones of higher risk. This method is considered very undesirable because it can actually present a greater risk of inadvertent shutdown or equipment malfunction, based on loss of electrical power, than the actual ground fault itself.

In addition, since contemporary practices in the industry generally rely on a separate and unrelated detection devices and admittedly marginal location methods, they offer very limited opportunities in locating intermittent, cycling or momentary ground faults or multiple ground faults on an ungrounded system. An intermittent ground fault results from a ground fault occurring in electrical equipment during a specific operation but not in any specific time cycle. In an industrial setting, various types of equipment may be of a power cycling nature between on and off. If this equipment also contains a ground fault, the detector will only sense the fault when the equipment is in the "on" position but not in the "off" position. Typically, after a ground fault has been detected by the detection system, an alarm is actuated, and a technician is dispatched in an attempt to locate the source of the ground fault or ground faults. During the time that the technician is investigating the ground fault, the strength of the ground fault may change or the ground may become intermittent, cycling or momentary stopping altogether, consequently making the entire location effort futile. Other ground faults may be hidden in control circuit operations and may occur only during the transitory operation of a single switch. The detector may detect the ground fault during the switch manipulation but not sense it when the switch is released, thereby sensing a momentary ground fault that will not be located when personnel are dispatched to investigate.

Thus, while certain techniques are available for detecting and locating ground faults in electrical distribution systems, present systems and methods are sub-optimal due to the inherent limitations in both the equipment and techniques known to those skilled in the art. Accordingly, it would be an improvement in the art to augment or even replace current equipment and techniques for both ground fault detection and location.

SUMMARY OF THE INVENTION

The present invention is implemented by deploying an enhanced ground fault detection and location apparatus and by using the apparatus in conjunction with specific circuit analysis methods, using the information generated by the ground fault detection and location apparatus. The ground fault detection and location apparatus comprises the functionality of a voltmeter, an ammeter, a frequency generator, and a variable power supply, thereby providing for a variety of signals and analyses to be performed on a unintentionally grounded circuit in an ungrounded AC or DC power distribution system. The apparatus includes a main unit and a remote unit, which may be a portable hand-held unit. In a first mode, the apparatus of the present invention can be used to detect ground faults. By switching to a second mode, the apparatus of the present invention can be used to locate ground faults.

The methods of the present invention involve the generation of various signals by the main ground fault detection and location unit. The generated signals are introduced into the electrical distribution system and monitored by various means, including one or more remote units. By analyzing the system-level response to the generated signals, the specific location of the ground fault or faults can be more readily ascertained, thereby promoting rapid and efficient repair and recovery practices. The apparatus of the present invention may be implemented as a dedicated, permanent installation or as a temporary portable system. Additionally, the system may be implemented as an automatic computer-controlled ground fault location and detection system.

BRIEF DESCRIPTION OF THE DRAWINGS

In order that the manner in which the above recited and other features and advantages of the present invention are obtained, a more particular description of the invention will be rendered by reference to specific embodiments thereof, which are illustrated in the appended drawings. Understanding that the drawings depict only typical embodiments of the present invention and are not, therefore, to be considered as limiting the scope of the invention, the preferred embodiments of present invention will be described and explained with additional specificity and detail through the use of the accompanying drawings wherein like designations denote like elements and.

DETAILED DESCRIPTION OF THE INVENTION

Figure 1:
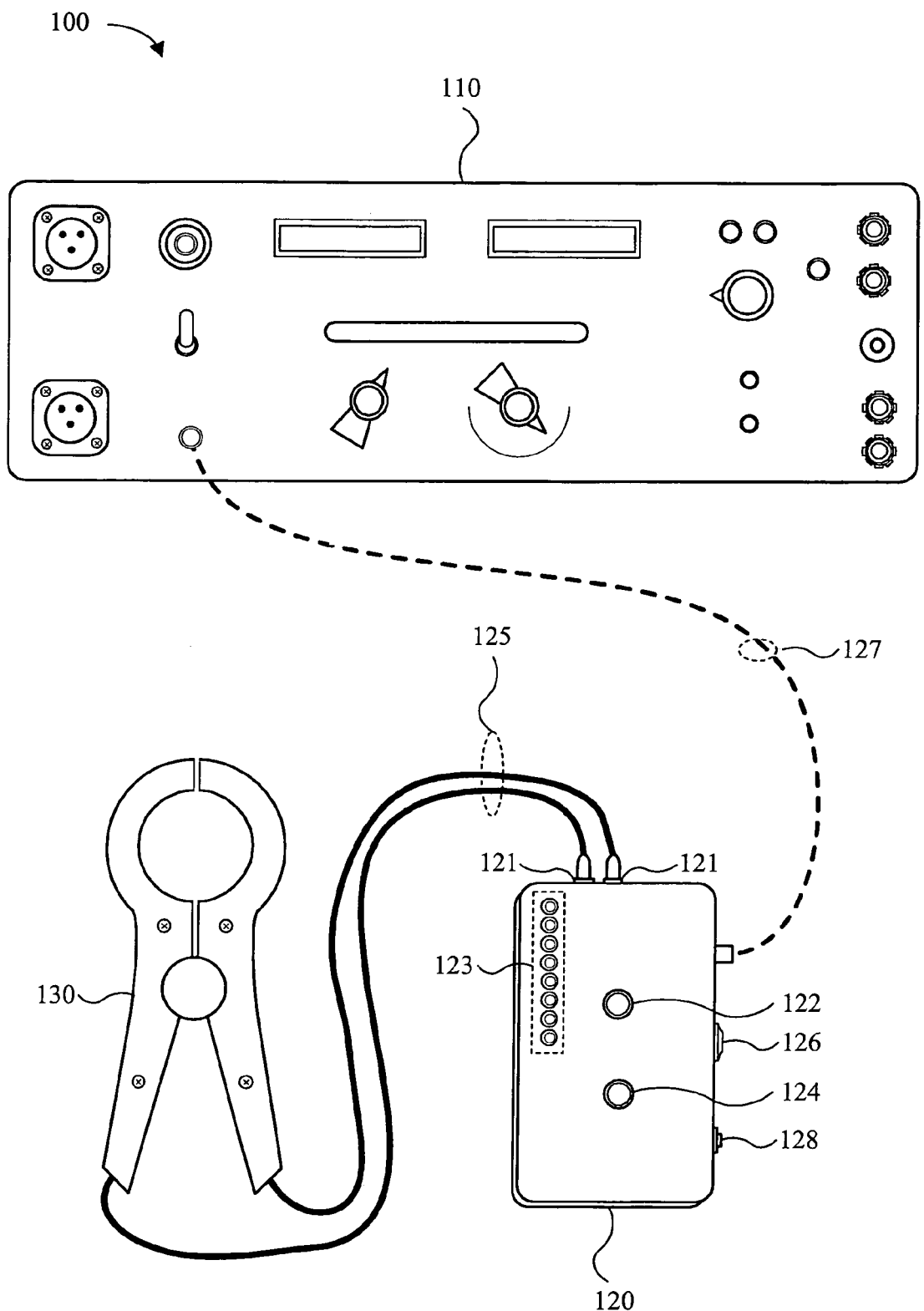
FIG. 1 is a schematic diagram of a system for detecting and locating ground fault currents in accordance with a preferred embodiment of the present invention.

The apparatus and methods of the most preferred embodiments of the present invention are configured to combine ground fault detection principles, ground fault location principles, circuit isolation principles, and current transformer principles to systematically detect and locate the source of a ground fault on an ungrounded electrical distribution system. The various preferred embodiments of the present invention provide an enhanced ground fault detection and location device that can be deployed as a portable ground fault detection and location system or as a permanently or semi-permanently mounted ground fault detection and location system.

One preferred embodiment of the present invention comprises a permanently mounted ground fault detection and location system that will detect a ground fault and assist the technician or operator in the effort to locate the circuit that contains the fault, whether the detected ground fault is a "hard" or "soft" ground, an intermittent ground, a cycling ground or even situations where the ungrounded system contains multiple ground faults. Further system troubleshooting methods and techniques described herein can be employed to locate the specific component or components that have created the ground fault.

In addition, at least one preferred embodiment of the permanent version of the present invention combines an ANSI device 64 with an ANSI device 27 and ANSI device 59 to provide under/over-voltage protection and ground fault protection within the same device. In this fashion, the apparatus of the present invention may be used to replace existing equipment while providing enhanced ground fault detection and location capabilities, thereby enhancing the robustness of the electrical distribution system.

In this prefer in addition to detecting/locating ground faults, we will be able to supply alarm contacts that will actuate when the source voltage goes below or above a settable value. We will also be able to provide a settable time delay to the operation of those contacts. We may include communication with the sensors and provide an optional output proportional to ground current and offset volts to be connected to a plant monitoring system.

Alternative preferred embodiments of the present invention also provide for a portable ground fault detection and location system that may be temporarily connected to an ungrounded circuit on an "as-needed" basis. The portable system may be used to detect a ground fault when it occurs and to locate the circuit or component that has caused the ground fault. This is true regardless of the specific nature of the ground fault or even in conjunction with an ungrounded system that suffers from multiple simultaneous ground faults. Because this preferred embodiment of the present invention is portable, the same techniques used to locate the circuit that contains the ground fault may also be used to locate the specific component that has faulted to ground.

Furthermore, the various preferred embodiments of the present invention recognizes that ground faults on many ungrounded systems generally occur in lower amperage circuits. These lower amperage circuits are not generally located on the main switchgear but are instead located in the smaller distribution switchgear that is typically fed from the larger main switchgear. The portable version of the present invention provides an option that will allow an independent power supply to be fed through the ground detection circuitry to provide a separate ungrounded power source to a suspected grounded circuit of lower amperage.

The separate power source can be added in parallel to the grounded circuit and, when the grounded circuit's normal source is removed, the load being fed by the grounded circuit will remain energized at all times while simultaneously being isolated from the ungrounded system. Should a ground fault occur on the isolated system, the portable ground fault detection device will sense it and troubleshooting can be performed to determine the source of the ground fault without introducing any negative impacts to the normal ungrounded system.

Accordingly, the systems and methods of the most preferred embodiments of the present invention provide the capability to detect and locate a grounded circuit on an ungrounded AC or DC system without de-energizing the circuit. Once the grounded circuit has been located, troubleshooting can be performed to isolate and repair or replace the grounded component. These and other features and advantages of the present invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be further understood from the description, as set forth hereinafter.

Referring now to FIG. 1, a block diagram of a ground fault detection and location system 100 in accordance with a preferred embodiment of the present invention is shown. As shown in FIG. 1, system 100 most preferably comprises a ground fault main unit 110; a ground fault location apparatus 120; and a current transformer 130.

Ground fault main unit 110 comprises a series of components, circuits, controls and interface elements that, taken together, provide a unique design for the detection and location of ground faults in an ungrounded AC or DC system. In the most preferred embodiments of the present invention, ground fault main unit 110 will also comprise a ground fault detector that is substantially similar to a typical ANSI device function 64. By including the functionality of this ground fault detector, preliminary information regarding ground faults can be assessed by ground fault main unit 110. Additional descriptive information about ground fault main unit 110 is presented below in conjunction with FIG. 2A.

Ground fault location apparatus 120 comprises a series of components, circuits, controls, and interface elements that can be used to monitor and interpret various signals provided by ground fault main unit 110 and an electrical distribution system. Additionally, by providing various types of feedback to a technician or to ground fault main unit 110, ground fault location apparatus 120 can be used to analyze an electrical distribution system to quickly and accurately locate ground faults in an ungrounded AC or DC electrical distribution system. Ground fault location apparatus 120 is communicatively linked to ground fault main unit 110 via communication link 127. Communication link 127 is any type of communication medium that may be used to transmit one or more data signals from ground fault location apparatus 120 to ground fault main unit 110. This includes wired and wireless communication mediums such as RF, Bluetooth, etc.

Ground fault location apparatus 120 is most preferably a hand-held unit that can be coupled to current transformer 130 and used in conjunction with ground fault main unit 110 to detect and locate ground faults in an electrical distribution system. The most preferred embodiments of ground fault location apparatus 120 comprise: a pair of input jacks 121; a frequency indicator 122; a signal strength indicator 123; a power indicator 124; a power switch 126; and a remote control switch 128. Ground fault location apparatus 120 may be selectively coupled to current transformer 130, via leads 125. In a permanent installation, ground fault location apparatus 120 may be permanently connected to current transformer 130 and simply left in place for future continual or periodic monitoring.

Input jacks 121 are used to connect ground fault location apparatus 120 to current transformer 130, thereby providing an input signal from current transformer 130 to ground fault location apparatus 120. Input jacks 121 are sized and configured to accept the probe leads from current transformer 130, thereby allowing the probe leads to be selectively inserted into input jacks 121.

Frequency indicator 122 is most preferably an LED that is selectively illuminated, based on the input received from current transformer 130, thereby providing a visual indicator to the operator of ground fault location apparatus 120 whenever the current sensing portion of current transformer 130 is positioned around a circuit that is oscillating at the desired frequency. In this fashion, frequency indicator 122 can be utilized to locate a circuit with a ground fault. Those skilled in the art will recognize that alternative means may be employed to indicate the presence of an electrical current oscillating at the desired frequency. For example, an audio signal could be used instead of or in addition to the LED to indicate the location of a circuit with a current oscillating at the desired frequency.

Signal strength indicator 123 is most preferably a bank of LEDs that are used to indicate the strength of the signal received by ground fault location apparatus 120, from current transformer 130. The stronger the signal, the more LEDs that will be lit up. If signal strength indicator 123 indicates a weak signal, the operator may choose to make adjustments to ground fault main unit 110, thereby boosting the ground fault current to enhance the possibility of locating the ground fault. Those skilled in the art will recognize that alternative means may be employed to indicate the presence of an electrical current oscillating at the desired frequency. For example, an audio signal could be used instead of or in addition to the LED to indicate the strength of the signal provide to ground fault location apparatus 120, from current transformer 130. In this case, the decibel level of the audio signal could be increased to correspond to the strength of the signal.

Power indicator 124 is most preferably an LED that is used to indicate that ground fault location apparatus 120 is functioning properly. Provided that ground fault location apparatus 120 is provided with appropriate power, power indicator 124 will be illuminated. In certain preferred embodiments of the present invention, power indicator 124 may also be illuminated based on the successful completion of one or more diagnostic checks for ground fault location apparatus 120 that are initiated upon the activation of ground fault location apparatus 120. Should ground fault location apparatus 120 fail the diagnostics on the power-up sequence, power indicator 124 may blink, thereby alerting the user of power indicator 124 that there has been a malfunction.

Power switch 126 is provided to turn ground fault location apparatus 120 on and off. To use ground fault location apparatus 120, power switch 126 is moved to the "on" position. When not in use, power switch 126 is moved to the "off" position, thereby conserving the power source contained within ground fault location apparatus 120.

Remote control switch 128 is provided to allow the operator of ground fault location apparatus 120 to temporarily disable the current generated by ground fault main unit 110, thereby providing a diagnostic capability that may be useful to determine whether or not the correct circuit has been located by current transformer 130. Whenever remote control switch 128 is depressed, the current generated by generated by ground fault main unit 110, is temporarily switched off. By alternatively depressing and releasing remote control switch 128, the user can verify that the correct circuit, and corresponding ground fault, has been located.

Current transformer 130 may be any standard current transformer known to those skilled in the art. Coupled with hand-held ground fault location apparatus 120, current transformer 130 may be used to locate ground fault currents in an electrical distribution system. In the most preferred embodiments of the present invention, current transformer 130 is a hand-held device with "clip-on" jaws that allow the current-sensing portion of current transformer 130 to be placed around the wires of a circuit without de-energizing the circuit and then removed when the tasks associated with locating the ground fault have been completed. In a permanent installation, current transformer 130 would be installed around the wires of the desired circuit and simply left in place for future continual or periodic monitoring.

Figure 2:
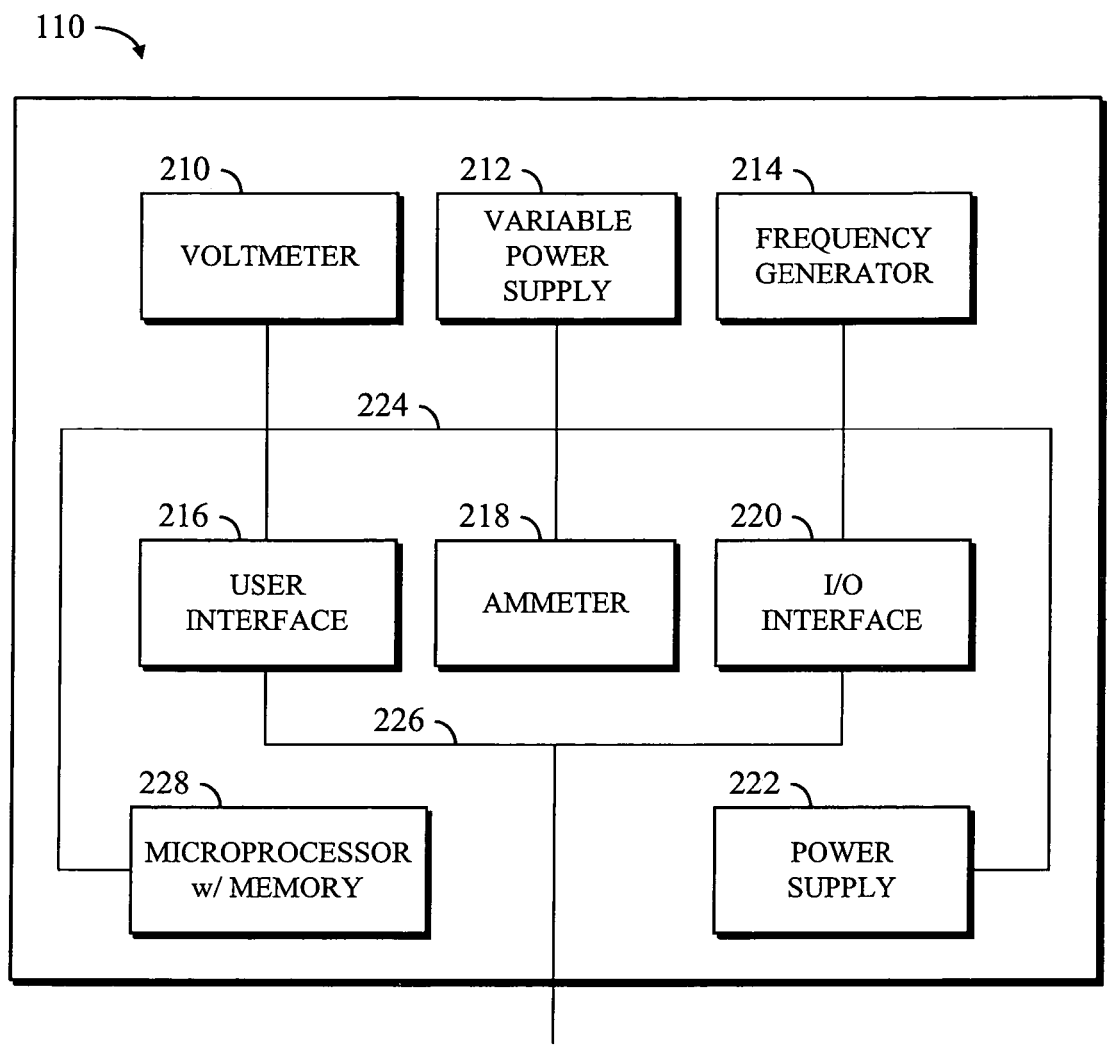
FIG. 2 is a block diagram of a ground fault main unit in accordance with a preferred embodiment of the present invention.

Referring now to FIG. 2, a schematic block diagram of a ground fault main unit 110 in accordance with a preferred embodiment of the present invention comprises a voltmeter 210; a variable power supply 212; a frequency generator 214; a user interface 216; an ammeter 218; an I/O interface 220; and a power supply 222 all connected via internal signal bus 224. Additionally, external bus 226 is provided for transmitting and receiving signals to and from external devices or sources.

Voltmeter 210 is not a standalone voltmeter in the traditional sense but is a collection of circuits that are configured to provide the functionality of a voltmeter within ground fault main unit 110 and in conjunction with the operation of system 100 of FIG. 1. By selectively activating the voltmeter functions of voltmeter 210, various voltage-related signals associated with the unintentionally grounded circuit can be detected and/or monitored, thereby providing an opportunity for troubleshooting and eventually locating the ground fault.

Variable power supply 212 is capable of producing a wide range of outputs, providing an opportunity to increase the ground fault current to levels that will be more detectable in the field. If the ground fault current is not detectable due to high resistance, then the amount of power supplied by variable power supply 212 can be increased, thereby increasing the level of ground fault current flowing in the circuit.

Frequency generator 214 is a frequency generator that is capable of generating a current that is oscillating at the "target" frequency. For the most preferred embodiments of the present invention, the "target" frequency is 2 Hz. Those skilled in the art will recognize that many other frequencies may be generated by frequency generator 214 and that 2 Hz is suggested for use in at least one preferred embodiment of the present invention but the present invention embraces the use of alternative frequencies, including frequencies in the range of 1 Hz to 10 Hz.

User interface 216 represents various dials, lights, meters, etc. that are provided in conjunction with ground fault main unit 110 to provide feedback to the user of ground fault main unit 110 regarding the operation of the various components of ground fault main unit 110, thereby providing an opportunity for troubleshooting and eventually locating the ground fault.

Ammeter 218 is not a standalone ammeter in the traditional sense but is a collection of circuits that are configured to provide the functionality of an ammeter within ground fault main unit 110 and in conjunction with the operation of system 100 of FIG. 1. By selectively activating the ammeter functions of ammeter 218, various current-related signals associated with the unintentionally grounded circuit can be detected and/or monitored, thereby providing an opportunity for troubleshooting and eventually locating the ground fault.

I/O interface 220 represents a various connections that provide an interface point for receiving or transmitting various signals to and from ground fault main unit 110 and other devices. For example, I/O interface 220 may be used to connect a standard chart recorder to ground fault main unit 110, thereby providing the opportunity to create a paper-based record of certain activities related to the operation of ground fault main unit 110. In alternative preferred embodiments of the present invention, I/O interface 220 may comprise a Universal Serial Bus (USB) port, thereby providing an interface to standard computer systems. This embodiment will be most valuable in permanent installations where a central processing unit (CPU) is used to control the functions of system 100 of FIG. 1.

Power supply 222 is the power source for ground fault main unit 110, providing power to the various components of ground fault main unit 110, via internal system bus 224. In the most preferred embodiments of the present invention, power supply 222 is an uninterruptible power supply (UPS) that is fed with a battery backup system. This allows for maximum robustness of power supply 222. Those skilled in the art will recognize that many other configurations are available for power supply 222, based upon the specific application and environment.

Microprocessor or central processing unit (CPU) 228 will be incorporated into certain alternative preferred embodiments of the present invention, particularly in those installations of a system 100 of FIG. 1 that are considered permanent or semi-permanent installations. For these alternative preferred embodiments of the present invention, CPU 228 will be a programmable control unit that will be programmed to perform ground fault detection and location activities on a scheduled and/or automated basis. As shown in FIG. 2, CPU 228 will also include a memory portion such as Random Access Memory (RAM).

Figure 2A:
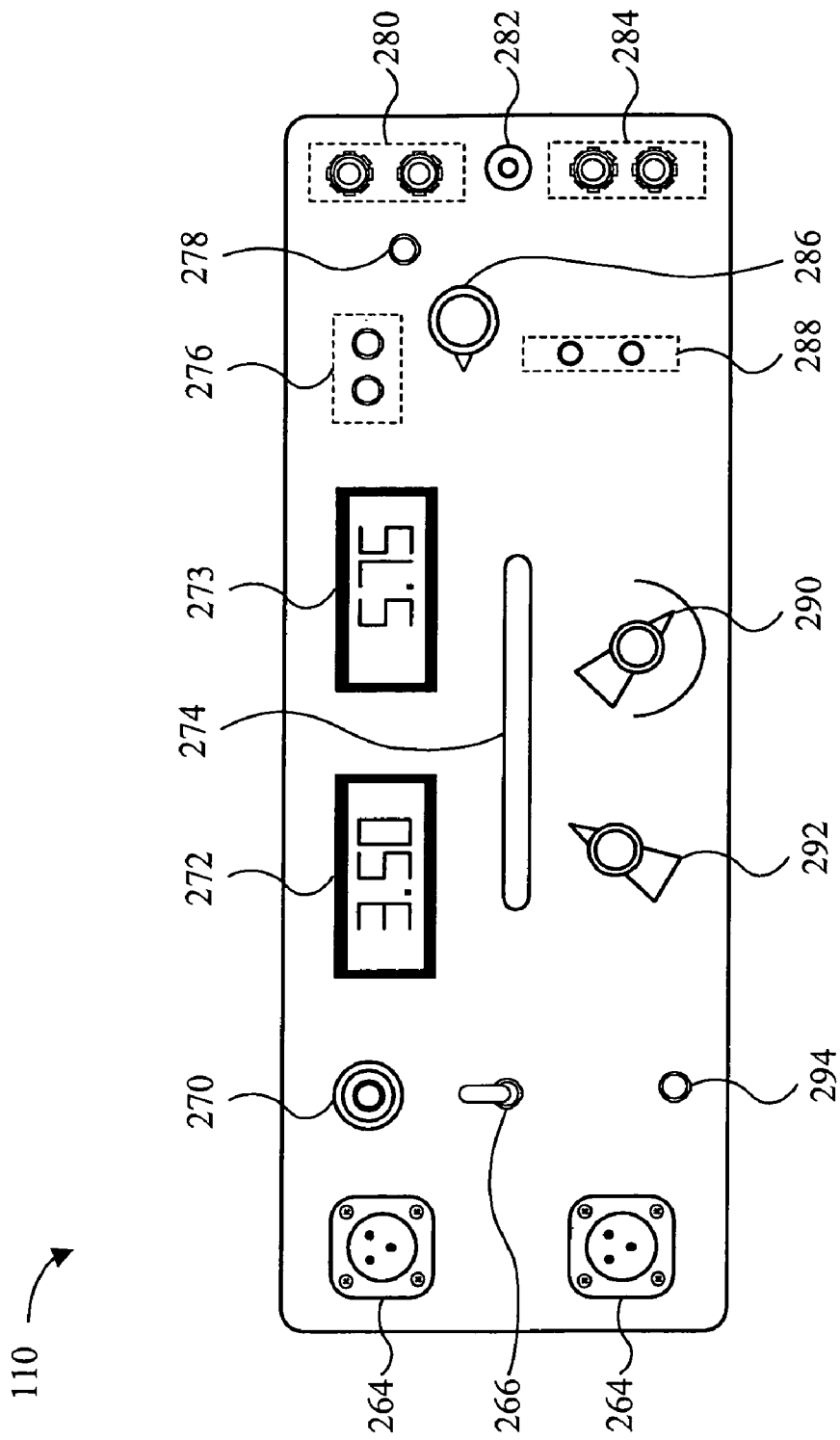
FIG. 2A is a schematic diagram of the operational controls for a ground fault main unit in accordance with a preferred embodiment of the present invention.

Referring now to FIG. 2A, the various controls and displays associated with ground fault main unit 110, are depicted. The various controls and displays associated with ground fault main unit 110, are used to set and adjust the functions of ground fault main unit 110 and to provide feedback to the operator of ground fault main unit 110, thereby assisting in the detection and location of ground faults in an ungrounded AC or DC power distribution system.

Ground fault main unit 110 comprises: a pair of circuit connection contact 264; an on/off switch 266; a fuse 270; a voltage display 272; a carrying handle 274; a current display 273; a pair of generator LEDs 276; a 278; a pair of chart recorder control terminals 280; a reset button 282; a pair of chart recorder output terminals 284; a pair of fault test buttons 288; a latch current selection dial 290; a 3-position control switch 292; and a sensor control input jack 294.

Circuit connection contacts 264 are used to connect ground fault main unit 110 to the positive and negative legs of an ungrounded, with one circuit connection contact 264 being connected to the respective legs, thereby integrating ground fault main unit 110 into the ungrounded electrical distribution system. In the most preferred embodiments of the present invention, a pair of internal balanced resistors (not shown this FIG.) will be placed in series between circuit connection contacts 264. The magnitude of the voltage across each of the internal balanced resistors can be monitored by voltmeter 210 of FIG. 2 to enable ground fault detection as set forth in conjunction with FIG. 5 below.

On/off switch 266 is provided to turn ground fault main unit 110 on and off. To use ground fault main unit 110, on/of switch 266 is moved to the "on" position. When not in use, on/off switch 226 is moved to the "off" position.

Fuse 270 is provided as a protection for system 100 of FIG. 1 and ground fault main unit 110. Should excess current be transmitted to ground fault main unit 110, fuse 270 will short out, thereby electrically disconnecting system 100 of FIG. 1 and ground fault main unit 110 from the ungrounded electrical distribution system.

Voltage display 272 is provided to offer a visual indication to the operator of system 100 of FIG. 1 regarding the magnitude of the ground fault current being detected by system 100 of FIG. 1. Since part of the troubleshooting methodology for locating ground faults in accordance with a preferred embodiment of the present invention includes the manipulation of the ground fault current, current display 273 can be an important part of the location process.

Carrying handle 274 is provided for transporting ground fault main unit 110 from one location to another. While system 100 of FIG. 1 may be deployed as a permanent installation, it is also anticipated that system 100 of FIG. 1 may also be deployed as a portable system, used in a variety of locations as the need arises. Carrying handle 274 may be constructed of any appropriate material, with durability and lightweight being desirable material characteristics.

Current display 273 is provided to offer a visual indication to the operator of system 100 of FIG. 1 regarding the magnitude of the ground fault current being detected by system 100 of FIG. 1. Since part of the troubleshooting methodology for locating ground faults in accordance with a preferred embodiment of the present invention includes the manipulation of the ground fault current, current display 273 can be an important part of the location process.

Chart recorder control terminals 280 are provided to control the starting and stopping of a chart recorder (not shown this FIG.) that may be connected to ground fault main unit 110 via chart recorder output terminals 284. Whenever the appropriate signal is generated by ground fault main unit 110, a signal will be sent to the chart recorder and the chart recorder will be activated. In the most preferred embodiments of the present invention, the activation of the attached chart recorder is controlled by the current level selected in conjunction with current selection dial 290. Any chart recorder suitable for use in a ground fault current monitoring application may be deployed in conjunction with the various preferred embodiments of the present invention. The use of chart recorders to monitor and record electrical system operational data is well known to those skilled in the art.

Reset button 282 is provided to reset the components of ground fault main unit 110, if necessary.

Chart recorder output terminals 284; are provided to send an input signal to a chart recorder (not shown this FIG.). The output signal from chart recorder output terminals 284 is a voltage signal that is proportionate to the ground fault current detected and monitored by ground fault main unit 110. Once activated, the chart recorder can capture the relevant data concerning the behavior of the ground fault current over time, thereby facilitating future troubleshooting activities.

Latch current selection dial 290 is provided so that the operator of system 100 of FIG. 1 can select the desired "trigger point" for activating the ground fault monitoring operations of ground fault main unit 110. For example, the operator may not be concerned about ground fault currents until they reach a certain level, such as 10 mA. In that case, the operator can adjust latch current selection dial 290 to the 10 mA position and, should a ground fault current equal to or in excess of 10 mA be detected by ground fault main unit 110, a chart recorder may be activated to monitor and record the magnitude and frequency of the ground fault current over a period of time. This allows for unattended operation of system 100 since system 100 can be set to monitor and record even intermittent or cyclical ground fault occurrences.

3-position control switch 292 is provided to switch ground fault main unit 110 of FIG. 1 from one mode of operation to another for troubleshooting and location purposes once a ground fault is detected or suspected. In the first mode, ground fault main unit 110 is configured to operate in the voltmeter mode, using voltmeter 210 of FIG. 2. In the voltmeter mode, the voltmeter can detect the polarity of the ground fault by measuring the voltage across each of the two internal resistors contained in ground fault main unit 110. This will allow a determination as to whether the ground fault has occurred on the positive or negative side of the circuit.

Next, 3-position control switch 292 can be used to switch ground fault main unit 110 into a second mode. In the second mode, ground fault main unit 110 is configured to operate in the ammeter mode, using ammeter 218 of FIG. 2. In the ammeter mode, the magnitude of the ground fault current can be measured. This can be useful to determine the relative nature of the ground fault, possible locations for the ground fault, as well as potential risk exposure for the overall electrical distribution systems as a whole, based on the magnitude of the ground fault current.

Finally, 3-position control switch 292 can be used to switch ground fault main unit 110 into a third mode where voltmeter 210 and ammeter 218 are bypassed and the ground fault current is oscillated by using frequency generator 214 of FIG. 2. If the magnitude of the ground fault current as measured by ammeter 218 is too low, variable power supply 212 can be used to amplify the magnitude of the ground fault current by increasing the voltage output associated with the induced oscillating ground current. While there are many possible choices for the oscillation frequency, the most preferred embodiments of the present invention will employ a frequency in the range of 1 Hz to 10 Hz. These frequencies have been selected to provide the most reliable system possible and to enhance the probability of locating the ground fault. Higher frequencies tend to be clustered in the same range as common circuit noise, thereby masking the actual ground fault current and making it more difficult to locate the ground fault current.

Sensor control input jack 294 is provided to transmit a signal from ground fault location apparatus 120 of FIG. 1 to ground fault main unit 110, thereby allowing the operator of ground fault location apparatus 120 to temporarily disable the current output generated by ground fault main unit 110. This functionality provides a diagnostic capability that may be useful to determine whether or not the correct circuit has been located by current transformer 130 of FIG. 1. As previously explained in conjunction with FIG. 1, ground fault location apparatus 120 is communicatively linked to ground fault main unit 110 via a communication link 127 (not shown this FIG.). Communication link 127 is any type of communication medium that may be used to transmit one or more data signals from ground fault location apparatus 120 to ground fault main unit 110. This includes wired and wireless communication mediums such as RF, Bluetooth, etc.

Whenever remote control switch 128 on ground fault location apparatus 120 is depressed, the current generated by ground fault main unit 110, is temporarily switched off. By alternatively depressing and releasing remote control switch 128 of ground fault location apparatus 120, the operator can verify that the correct circuit, and corresponding ground fault, has been located.

Those skilled in the art will recognize that the specific representations presented in conjunction with the description of FIG. 2A are merely illustrative in nature and are not limiting or exhaustive. Additionally, the exact placement, size shape, etc. of the controls depicted in FIG. 2A are not to be interpreted as limiting in nature but serve as examples of one specific preferred embodiment of the present invention. Accordingly, many deviations for preferred exemplary embodiment shown in FIG. 2A are contemplated as being within the scope of the present invention. For example, it is anticipated that certain preferred embodiments of the present invention may replace switches with levers, meters with gauges, buttons with switches, etc. Any such substitutions are encompassed in the various preferred embodiments of the present invention.

Figure 3:
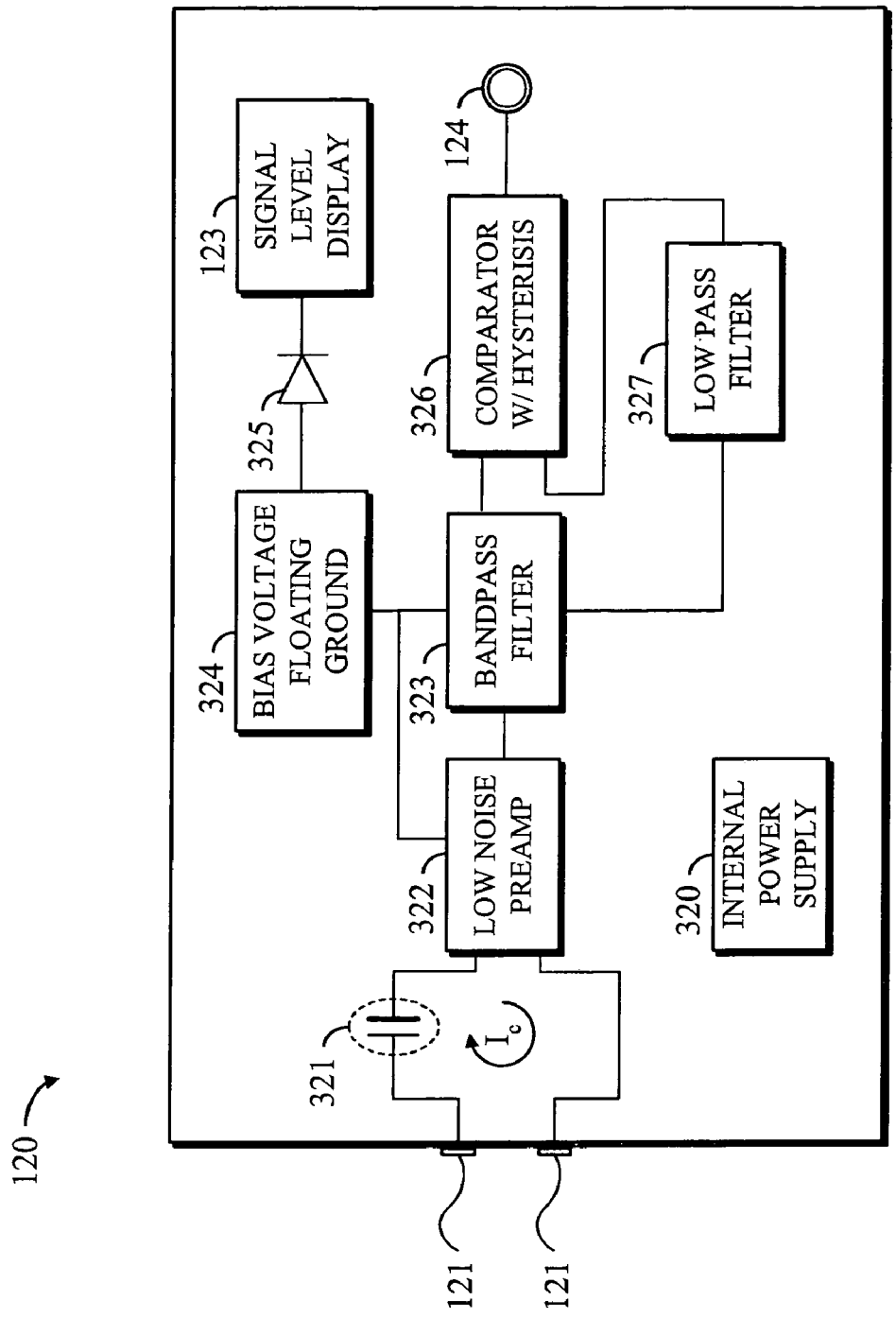
FIG. 3 is a block diagram of a ground fault location apparatus in accordance with a preferred embodiment of the present invention.

Referring now to FIG. 3, a block diagram of hand-held ground fault location apparatus 120 of FIG. 1 is shown. One of the most preferred embodiments of ground fault location apparatus 120 comprises: one or more input jacks 121; an internal power supply 320; a resonating capacitor 321; a low noise preamp 322; a band-pass filter 323; a bias voltage floating ground 324; a diode 325; a comparator 326; a low-pass filter 327; signal level display 328; and LED 124.

As shown in FIG. 3, input jacks 121 are provided for inserting the probe leads for a standard current transformer, such as current transformer 130 of FIG. 1 (not shown this FIG.). Once the probe leads of the current transformer 130 are inserted into input jacks 121, hand-held ground fault location apparatus 120 may be used in conjunction with portable ground system 110 of FIG. 1 (not shown this FIG.) to locate ground faults in an electrical distribution system.

Internal power supply 320 is any suitable power source that may be used to provide power to the various components of ground fault location apparatus 120. Internal power supply 320 is connected via an internal bus or distribution system (not shown this FIG.) to provide power to the various components of ground fault location apparatus 120. In the most preferred embodiments of the present invention, internal power supply 320 comprises one or more disposable battery such as a 9V battery or a pair of AA batteries. These sizes of batteries are readily available and allow for easy replacement of power supply 320 as necessary. By deploying common replaceable batteries for internal power supply 320, ground fault location apparatus 120 becomes a portable and easily transported device that can be used in the ground fault current detection process.

While the most preferred embodiments of the present invention embrace a hand-held ground fault location apparatus 120, those skilled in the art will recognize that power supply 320 may also be implemented as a more permanent connection to a more robust power supply for a permanent or semi-permanent installation. A more robust power supply would become the power source for those preferred embodiments of the present invention that embrace a permanent ground fault detection system with multiple ground fault location monitors employed on multiple branch circuits, thereby providing continuous monitoring and location capabilities for detecting and eliminating ground fault currents.

Resonating capacitor 321 works in concert with a feedback resistor contained in low-noise preamp 322 to enhance the input signal introduced into ground fault location apparatus 120 from current transformer 130 via input jacks 121. The circulating current Ic is the input signal into low-noise preamp 322. The circulating current ° C. flows through a feedback resistor contained in low-noise preamp 332, producing a significant amount of gain, thereby noiselessly amplifying the current signal from current transformer 130.

Low-noise preamp 322 is provided to convert the resonated input current into a voltage out from low-noise preamp 322. The input impedance of low-noise preamp 322 is relatively low and, accordingly, the quality factor or "Q" factor for the circuit shown in FIG. 3 is $2\pi wL/Rct$.

Band-pass filter 323 is a filter device that passes frequencies only within a certain range and rejects (attenuates) frequencies outside that range. While the frequency range for band-pass filter 323 is variable and selected based upon a specific application, the most preferred embodiments of the present invention will typically employ a band-pass filter that will pass only frequencies slightly above and slightly below the desired frequency. Accordingly, with a desired frequency of 2 Hz, band-pass filter 323 would be designed to pass any frequency in the 1.5 Hz to 2.5 Hz range and screen out any signals operating in a frequency outside that range. Band-pass filter 323 is designed to remove signal spikes and spurious noise that would otherwise interfere with the operation of LED 124, particularly those signals that would create a "false positive" signal. Those skilled in the art will recognize that the range of frequencies can be expanded or contracted to ensure that only the desired frequency range is passed by band-pass filter 323.

Bias voltage floating ground 324 provides a single supply low impedance point to simulate ground creates reference voltage and enables the use of a single supply voltage 320.

Diode 325 acts as a "check valve" and is provided to prevent a negative signal from being introduced into signal level display 123.

Comparator 326 provides the output signal to control the illumination of LED 124. The two input signals for comparator 326 are the output signals from band-pass filter 323 and low-pass filter 327. It should also be noted that comparator 326 employs hysteresis so as to limit the minimum detectable signal for output purposes, thereby ensuring that LED 124 is not activated due to spurious noise in the circuit.

Low-pass filter 327 is a filter that is specifically designed to pass low frequencies, but that will also attenuate (or reduce) frequencies higher than the desired cutoff frequency. The actual amount of attenuation for each frequency varies for each specific application, but the most preferred embodiments of the present invention will employ a low-pass filter 327 that has been designed to have a cutoff frequency in the range of 0.0033 Hz. This will prevent higher level frequencies from entering comparator 326. Low-pass filter 327 may not be necessary in all embodiments of the present invention but for those implementations where an amplified offset voltage in the preamp and filter cause the average DC to be different (by a small amount) from the targeted bias voltage, then low-pass filter 327 may be used to correct the difference. Additionally, low pass filter 327 will preferably have a cutoff frequency much lower than 2 Hz, so the output of low-pass filter 327 is the average of the output of the band-pass filter 323. When the 2 Hz signal is higher than the average, LED 124 is turned on and when the 2 Hz signal is lower than the average, LED 124 is turned off. The time constant of low-pass filter 327 is approximately 50 seconds, but there is a ten times speedup circuit to reduce the time for the overall circuit to be usable.

Signal level display 123 provides a visual feedback indicator to inform the operator as to the strength of the signal being monitored by ground fault location apparatus 120.

LED 124 provides a visual feedback indicator to inform the operator as to the presence of a current operating in the desired or "tuned" frequency range. In the most preferred embodiments of the present invention, the various components of ground fault location apparatus 120 are configured to illuminate LED 124 in the presence of a current oscillating at a frequency at or about the 2 Hz level. Since this is the designated or desired frequency, when a circuit is oscillating at or about this frequency, the operator has a good indication that the circuit is the source of the ground fault current. This will allow the operator to begin to isolate and/or repair the circuit as necessary.

Figure 4:
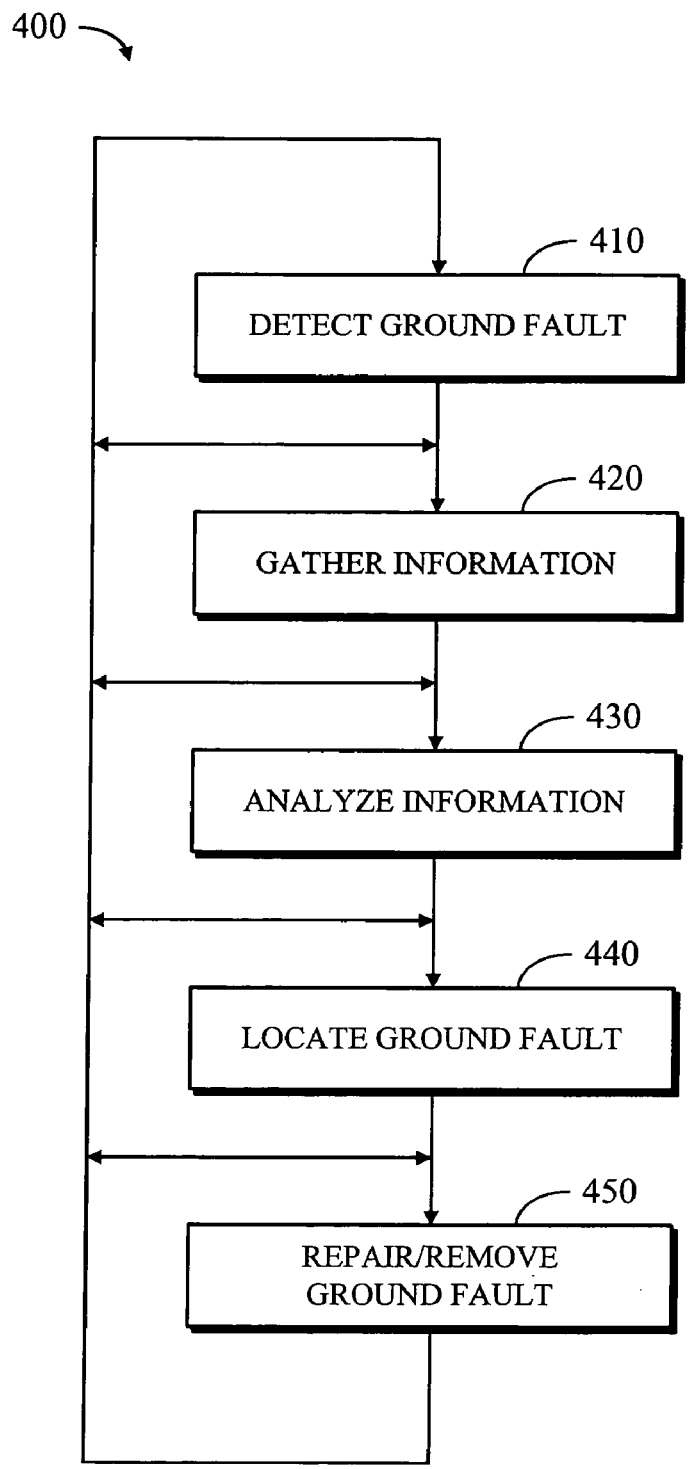
FIG. 4 is a flow chart for a method of detecting, locating, and repairing ground faults in accordance with a preferred embodiment of the present invention.
Figure 5:
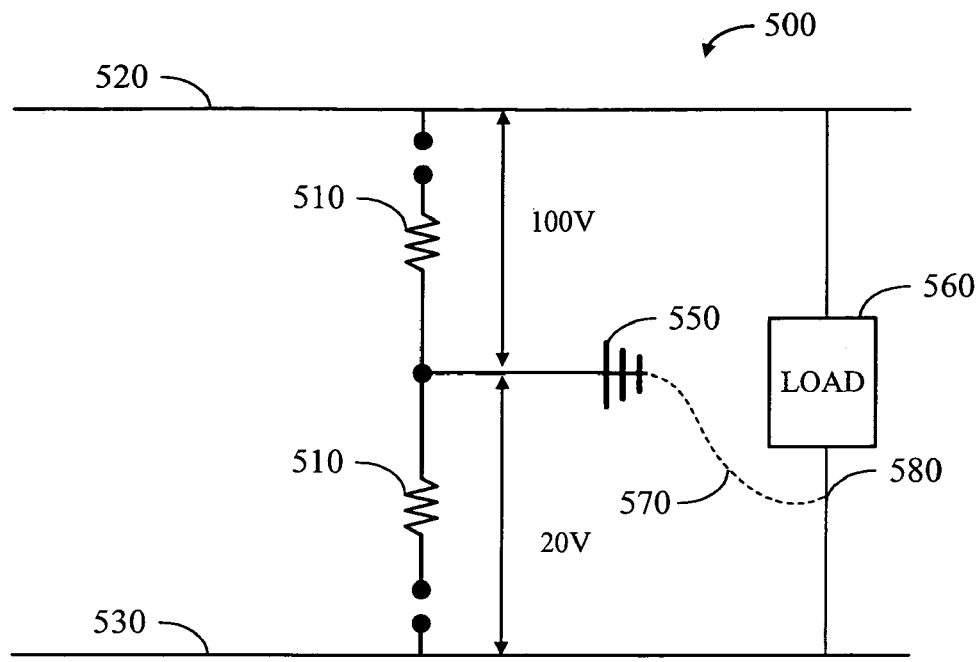
FIG. 5 illustrates a common mode voltage (CMV) circuit connection in accordance with a preferred embodiment of the present invention.

Referring now to FIG. 4, a method 400 for detecting and locating a ground fault in accordance with a preferred embodiment of the present invention is depicted. As shown in FIG. 4, the first step is to detect a ground fault (step 410). The process of detecting a ground fault in accordance with the most preferred embodiments of the present invention is similar to the techniques presently known to those skilled in the art with the notable difference that the detection can be accomplished by using ground fault main unit 110 of FIG. 1. A typical ground fault detection circuit, such as will be incorporated into ground fault main unit 110 of FIG. 1 is depicted in FIG. 5.

Next, using the various preferred embodiments of the present invention previously described in conjunction with FIG. 1, FIG. 2, and FIG. 3, additional information about the detected ground fault can be gathered (step 420) in an attempt to locate the most likely source of the ground fault detected in step 410. For example, by evaluating the magnitude of the voltage across each of the internal resistors contained within ground fault main unit 110 of FIG. 1 and FIG. 2, a determination can be made as to whether the ground fault has occurred on the positive or negative side of the circuit, effectively eliminating one half of the circuit and related components from the troubleshooting process.

Next, the information gathered by the various components of system 100 of FIG. 1 may be analyzed (step 430) and used to determine the most probable location for the ground fault detected in step 410.

Once the analysis has been completed, one or more technicians may be dispatched to the suspected location of the ground fault (step 440). The process of locating the ground fault will generally consist of placing one or more current transformer and ground fault location apparatus combinations (not shown this FIG.) over one or more branch circuits in an attempt to verify the location of the ground fault. If the monitored circuit is oscillating at the target frequency, then the technician can be fairly certain that they have located the appropriate branch circuit where the ground fault has occurred. To further solidify and confirm their findings, the technician may depress a button on the ground fault location apparatus, thereby temporarily disabling the oscillating current generated by the ground fault main unit of system 100 of FIG. 1.

Once the ground fault has been successfully located the defective circuit or component may be repaired or replaced (step 450). The exact nature of the repair or replacement to be made will be determined by the technician on a case-by-case basis.

In the following six paragraphs, each of the main circuits or components, that make the present invention of a ground fault detection and location system, unique will be discussed in detail. The following paragraphs illustrate components and circuitry that the present invention incorporates in it's permanent and portable ground fault detection and location equipment, thereby making the present invention unique in design. These circuits or components are "Offset voltage," "continuous offset voltage," "ground fault current measurements," "ground fault current oscillation," "common mode voltage," and a "cordless hand held signal tracer."

Some embodiments of the present invention enable the ground fault detector to contain circuitry that will allow the measurement of "offset voltage" to be taken. As shown in FIG. 5, the "meter" is a voltmeter and is depicted as a hand held meter only for illustration purposes, the voltmeter is to be built into the ground detection device. An offset voltage measurement is obtained from the meter by removing the intentional ground from the ground detector and measuring the voltage or difference of potential between the center point of the balance resistors to ground. On an ungrounded system that has a fault to ground, this measurement will allow a technician to determine the percentage of the field device where the ground fault has occurred. The polarity of the voltmeter will also indicate whether a ground fault has occurred nearer the positive side from the center of the field device for DC circuits (hot side for AC circuits) or the negative side (common side for AC circuits) of the circuit. After the measurement has been taken, the intentional ground will be restored to the center point of the balance resistors.

Some embodiments of the present invention enable the ground fault detector to contain circuitry that will allow a continuous offset voltage reading (as described above) to be taken by connecting a chart recorder to "test lead connecting jacks" on the ground fault detector. A continuous ground fault can be monitored in this fashion to determine if it's ground fault strength or percentage of the field device that the ground fault has occurred at, has changed over time.

Some embodiments of the present invention enable the ground fault detector to contain circuitry that will allow the measurement of "ground fault current" to be taken, as shown FIG. 5, where the "meter" is now an ammeter. Ground fault current is the flow of current from the field device fault to ground (unintentional ground) to the ground detector intentional ground. This measurement will also be used to determine the strength of the ground fault.

Figure 6:
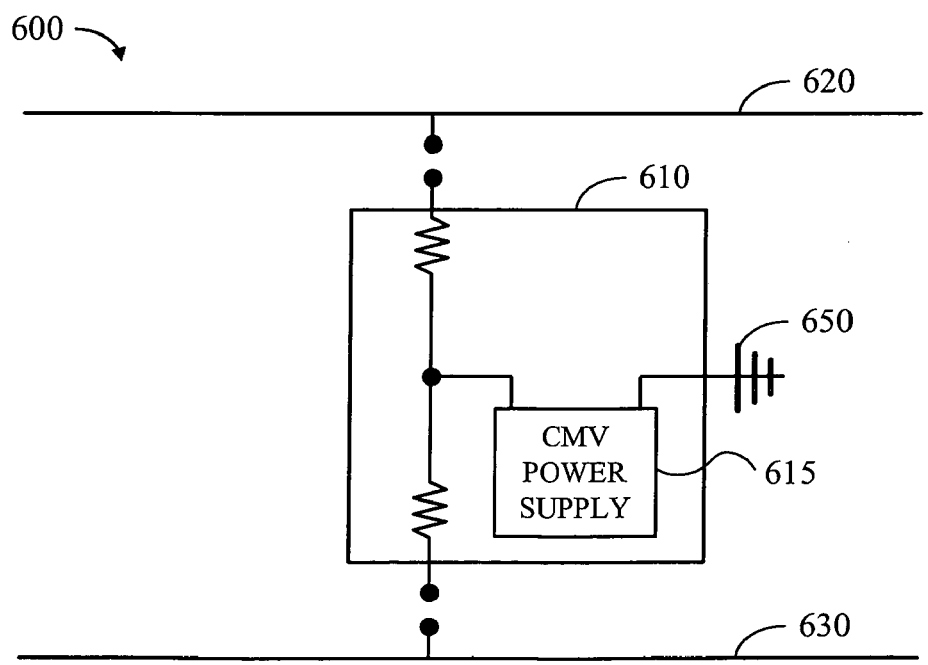
FIG. 6 illustrates a common mode voltage (CMV) circuit connection in accordance with a preferred emdodiment of the present invention.

Some embodiments of the present invention enable the ground fault detector to initiate ground fault current oscillation. Ground fault current oscillation is used as a ground fault location technique. It is accomplished by changing the steady state current of DC ground fault current to an oscillating current for DC systems or by changing the rate of oscillation of AC ground fault current to a slower rate for AC systems, as shown in FIG. 6. The oscillation circuitry is built into the ground detector, so that when a ground fault occurs, and location techniques are to be employed, the ground fault current can then be oscillated at a rate of less than 60 hertz. The most preferred rates for current oscillation is in the 1 Hz to 10 Hz range, with 2 Hz being the most preferred frequency for location of the ground fault.

Some embodiments of the present invention enable detecting the ground fault current oscillations, produced by the ground detector device, with a hand held signal tracer. The tracer is comprised of a current transformer, a signal detector and an indication light (LED), see FIG. 7. The signal detector is comprised of common circuitry that is designed to accept or pass the frequency that the ground fault current is being oscillated at and reject or block all other frequencies. Using this technique, the hand held signal tracer will not inadvertently actuate by detecting random noise frequencies and random frequencies will not interfere with the ground fault location method. The detector can also be comprised of Phase Lock Loop (PLL) circuitry (common to the industry) that will enable it to be wireless and independent of the ground fault detector. The technician can therefore initiate ground fault current oscillation and "freely" move about the suspected circuit and components and attempt to locate the oscillating ground fault current signal. Multiple hand held signal tracers can also be used that are positioned at various locations of an anticipated or suspected circuit fault to ground.

Referring now to FIG. 5, a relatively well-known circuit configuration 500 for detecting the presence of ground faults is depicted. A pair of matched resistors 510 are placed in series between the positive side 520 and negative side 530 of circuit 500. Load 560 is operated in parallel with resistors 510 with the center point of resistors 510 being connected to a ground point 550. In normal operation, the voltage across each resistor 510 is equal and is one half of the total voltage supplied to load 560. However, as shown in FIG. 5, with the introduction of a ground fault at point 580, a ground fault current will begin to flow along current path. As shown in FIG. 5, the voltage distribution across resistors 510 is now unbalanced. By monitoring the voltage levels across resistors 510, the presence of a ground fault can be detected.

Referring now to FIG. 6, a system 600 for locating ground faults in accordance with a preferred embodiment of the present invention is depicted. As shown in FIG. 6, a ground fault detector unit 610 is positioned between the positive side 620 of the supply system and the negative side 630 of the supply system. Ground fault detector unit 610 includes a CMV power supply 615 that is connected to a In this fashion, system 600 of FIG. 6 is configured to introduce a "common mode voltage" or CMV into the ground fault location process. This embodiment is particularly useful in situation where a ground fault has been detected but the ground fault current is very low due to a very high resistance fault to ground. In this situation, the oscillations of the ground fault current induced in the system may be too small to detect with the hand-held ground fault location apparatus 120 as described in conjunction with FIG. 1 and FIG. 3.

Accordingly, to increase the probability of locating the ground fault, a CMV is introduced into system 600 to raise the voltage across the actual ground resistance and thereby increase the amount of ground fault current that is flowing in the system. The CMV is a voltage introduced into the system by removing the intentional ground from ground fault detector unit 610 and adding voltage source or power supply ground fault detector unit 610 between the center point of ground fault detector unit 610 and the intentional grounding point 650 of ground fault detector unit 610, as shown in FIG. 6. This configuration will raise the ground fault current to a magnitude sufficient that the presence of the ground fault current can be detected by using handheld ground fault detection apparatus 120 of FIG. 1.

includes a ground fault main unit 610 deployed in a permanent configuration, thereby replacing the "normal service" ground detector typically installed in conjunction with the main switchgear.

In this alternative preferred embodiment of the present invention, the permanently mounted ground fault main unit 610 includes contacts to operate a local or remote alarm or both alarms. If a hard ground is detected and is continuous, the "hard ground" contacts of the detector would remain closed until the ground went away and the local or remote alarm would not be able to reset the alarm until the ground cleared. If a soft ground is detected and remains detectable, only a momentary signal would be sent to the local or remote alarm that could be reset even if the "soft" ground is continuous (still in). After a specified (adjustable) amount of time, and if the soft ground is still in, then the device sends another signal to the remote alarm, verifying that a soft ground still exists. If the soft ground becomes a hard ground, then the alarm contacts would remain closed to the remote alarm.

For certain preferred embodiments of the present invention, a more permanent installation of system 100 of FIG. 1 will be installed. This preferred embodiment will comprise a microprocessor controlled ground fault main unit 110 that is programmed by the technician and that will not have the buttons, switches, etc. shown in conjunction with FIG. 2A. The permanent embodiment will be microprocessor or CPU based and the required settings to be initially configured by the user. The external chart recorder previously explained will be replaced by the inclusion of an internal event recorder with date, time, source voltage, amount of offset voltage, and ground fault current all being monitored and recorded on a regularly scheduled and user-configurable basis. Data will be analyzed and calculated by the device itself.

Additionally, for the most preferred embodiments of the permanent or semi-permanent installation, branch circuit current transformer modules will be installed at strategic locations in the ungrounded electrical power distribution system. These current transformer modules will be a slightly modified version of current transformer 130 of FIG. 1 with some important modifications and will perform the same type of functionality as current transformer 130 described in conjunction with FIG. 1.

Figure 7:
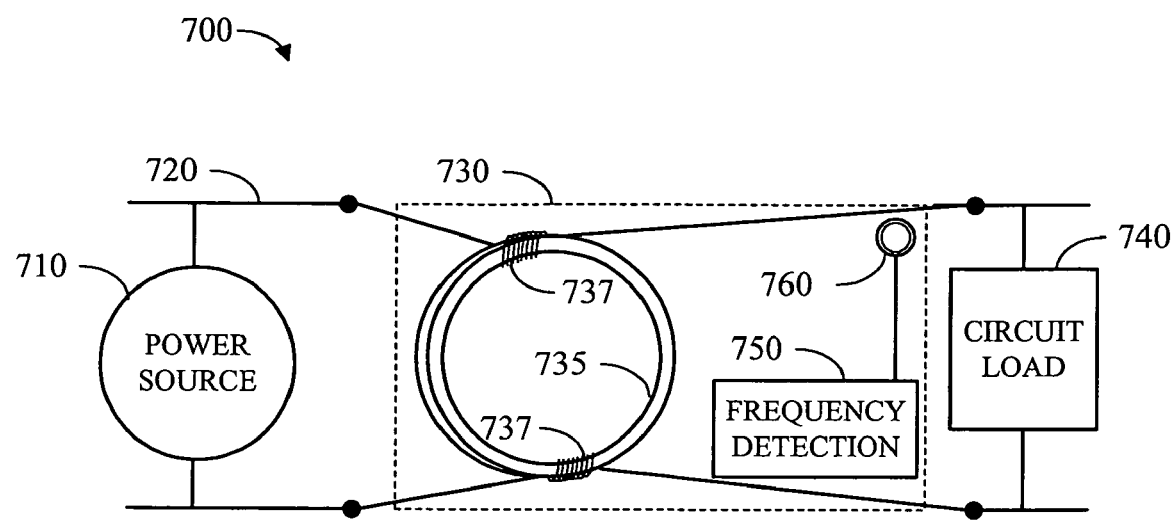
FIG. 7 is a schematic diagram of a current transformer used in a permanent or semi-permanent ground fault detection and location apparatus in accordance with an alternative preferred embodiment of the present invention.

Referring now to FIG. 7 a schematic diagram 700 for a current transformer module 730 installed in a branch circuit 720 in accordance with a preferred embodiment of the present invention for a permanent or semi-permanent installation of a system for detecting and locating a ground fault in an ungrounded AC or DC power distribution system is depicted. The most preferred embodiments of the permanent installation contemplate the use of a plurality of current transformer modules 730 installed in strategic locations through the system.

As shown in FIG. 7, a current transformer module 730 is installed in branch circuit 720 between power source 710 and load 740. For this type of installation, it will be necessary to install current transformer 730 prior to energizing branch circuit 720. Alternatively, branch circuit 720 may be periodically de-energized for maintenance purposes and current transformer module 730 could be installed at that time.

A current transformer module 730 in accordance with a preferred embodiment of the present invention comprises a current transformer portion 735 with pre-wrapped primary lead windings 737, a target frequency signal detection circuit 750 and a target frequency indicating LED 760. Windings 737 serve to amplify the ground fault current oscillations at the target frequency produced by the ground fault detection and location apparatus and target frequency signal detection circuit 750 is configured to illuminate LED 760, upon detection of a ground fault current oscillating at the target frequency, thereby indicating a ground fault in branch circuit 720. Amplification of the ground fault current oscillation is achieved by "wrapping" primary lead windings around current transformer portion 735 with the amount of amplification being proportional to the number of "wraps." Accordingly, 10 wraps around current transformer portion 735 will produce a "10 times" amplification of the ground fault current detected by current transformer module 730.

The device we are replacing is the ground detector "device 64". On DC and AC systems there are other devices such as a 27 (or undervoltage), a 62 (or time delay for alarm) and a 59 (or overvoltage) device. We intend to build all of these features into one device, our permanently mounted 64 device. So in addition to detecting/locating ground faults, we will be able to supply alarm contacts that will actuate when the source voltage goes below or above a settable value. We will also be able to provide a settable time delay to the operation of those contacts.

Some embodiments of the present invention's ground detector allow it to monitor voltage conditions and actuate a set of contacts for an adjustable under-voltage condition or an over-voltage condition thereby with the present invention the 64 device, the 27 device and the 59 device are built into one device. These contacts can be used to initiate a local or remote alarm, trip or both.

With a permanent installation, multiple current transformers, such as those previously described in conjunction with FIG. 1, may be employed to provide a continuous monitoring environment for multiple branch circuits. In this embodiment, the current transformers will typically be "clip-on" current transformers, allowing the current transformers to be installed without de-energizing the branch circuits at the time of installation. These various alternative preferred embodiments of the present invention are designed to allow an industrial plant to utilize as many clip-on current transformer detectors as desired, monitoring as many branch circuits as necessary or desired.

Some embodiments of the present invention enable detecting the ground fault current oscillations, produced by the permanently mounted ground detector device, by the use of permanently mounted current transformer modules at each breaker. These modules serve to amplify the ground fault current oscillations produced by the ground detector device and illuminate an LED indication, indicating a ground fault exists in the circuit that the module is monitoring. Amplification of the ground fault current oscillation is achieved by "wrapping" the circuit primary leads around a current transformer, the amount of amplification is proportional to the amount of "wraps", 10 wraps will produce a "10 times" amplification. A "module" contains a current transformer, a pre-wrapped primary leads, a signal detection circuit and an indicating LED. The advantage of the previously discussed two paragraphs is that circuit ground fault location occurs without any human intervention. Moreover, the location is performed continuously, 24 hours a day, seven days a week. Furthermore, the present invention will be able to capture momentary, cycling, intermittent or multiple ground faults.

Accordingly, as will be further discussed below in the following three paragraphs, those skilled in the art will appreciate that the following embodiments of the present invention listed for representative illustration only, allow it to be used as portable ground fault detection and location system.

Some embodiments of the present invention's ground detector allow it to be a portable ground detection and location system. In these embodiments, the normal ground detector device is removed temporarily from the larger switchgear during troubleshooting. The portable ground detector/locator is connected to suspected circuits containing a ground fault and the ground current is oscillated while the hand held signal detector is clipped around the cable feeding the field device. If the field device or cabling contains the ground fault and the ground current is of sufficient magnitude, the LED of the hand held detector will illuminate.

Some embodiments of the present invention enable the field device to be fed through the portable ground detector/locator by an isolation device. The nature of the "isolation device" is to change the electrical energy supplying its input to another form of energy, transfer this from of energy to the output and change the energy back to electrical connection from input to output, hence the term "isolation device". The output can then be paralleled onto an existing normally energized source at a junction point and the normal source removed. The load will now be electrically isolated from the normal distribution system without ever being de-energized. Thus, any ground that comes in on the secondary or load side of the isolation device is isolated from the system feeding it. Each circuit can then be isolated one at a time without de-energizing them until the circuit that contains the ground fault is found. Such an isolation device comes in several forms, such as an AC-to-DC transformer or DC-to-AC converter for AC systems or a DC-to-DC converter or AC-to-DC converter is used for DC systems or other such converters who's output voltage matches the normal ungrounded system voltage. In addition the ground fault detector/locator may remain as a separate device or may be built into an isolation device.

Some embodiments of the present invention enable detecting the ground fault current oscillations, produced by the ground detector device, by the use of a permanently mounted current transformer in the ground detector itself. In effect the module is built into the portable unit rather than installing modules at each circuit. If a high resistance ground is on the suspected circuit, the ground fault current will be amplified according to the amount of "wraps" of the internal mounted current transformer.

As discussed herein, the various preferred embodiments of the present invention embrace systems and methods for locating one or more ground fault in an ungrounded electrical distribution system. More particularly, the present invention relates to systems and methods for locating ground faults in an ungrounded AC or DC system without de-energizing the system, and enabling isolation of the grounded component of the circuit. Lastly, it should be appreciated that the illustrated embodiments are preferred exemplary embodiments only, and are not intended to limit the scope, applicability, or configuration of the present invention in any way. Rather, the foregoing detailed description provides those skilled in the art with a convenient road map for implementing one or more preferred exemplary embodiments of the present invention. Accordingly, it should be understood that various changes may be made in the function and arrangement of elements described in the exemplary preferred embodiments without departing from the spirit and scope of the present invention as set forth in the appended claims.

The invention claimed is:

1. A ground fault detection and location system comprising:
    a ground fault main unit, said ground fault main unit comprising a frequency generator, said frequency generator generating an oscillating ground current in a normally ungrounded circuit at a pre-determined target AC frequency;
    a low-noise pre-amp;
    a ground fault location apparatus, said ground fault location apparatus comprising:
        a bandpass filter coupled to said low-noise pre-amp;
        a bias floating ground coupled to said resonating capacitor and said bandpass filter;
        a diode coupled to said bias floating ground;
        a signal level display coupled to said diode;
        a comparator with hysterisis coupled to said bandpass filter;
        a low pass filter coupled to said bandpass filter and said comparator with hysterisis; and
        an internal power supply;
    a resonating capacitor coupled to said low-noise pre-amp, said resonating capacitor and said low-noise pre-amp being configured to amplify a current signal, thereby creating an amplified current signal;
    a communication link coupling said frequency generator to said ground fault location apparatus; and
    a current transformer, said current transformer being selectively coupled to said ground fault location apparatus, said current transformer monitoring said oscillating ground current and locating a ground fault by detecting said target AC frequency.

2. The ground fault detection and location system of claim 1 wherein said ground fault location apparatus is a portable hand-held device.

3. The ground fault detection and location system of claim 1 wherein said ground fault location apparatus is a device that has been installed into an electrical distribution system.

4. The ground fault detection and location system of claim 1 wherein said ground fault location apparatus further comprises a frequency indicator, said frequency indicator being configured to provide a visual indication whenever said target AC frequency is detected by said current transformer.

5. The ground fault detection and location system of claim 1 wherein said ground fault location apparatus further comprises:
    a frequency indicator, said frequency indicator being configured to provide a visual indication whenever said target AC frequency is detected by said current transformer;
    a remote control switch, said remote control switch being configured to temporarily disable said oscillating ground current; and a signal strength indicator, said signal strength indicator being configured to provide an indication of the strength of said oscillating ground current.

6. The ground fault detection and location system of claim 1 wherein said ground fault location apparatus further comprises a plurality of input jacks, said plurality of input jacks being sized and configured to accept at least one probe lead from said current transformer.

7. The ground fault detection and location system of claim 4 wherein said target AC frequency is a frequency in the range of 1 Hz-10 Hz.

8. The ground fault detection and location system of claim 4 wherein said target AC frequency is equal to 2 Hz.

9. The ground fault detection and location system of claim 1 wherein said ground fault main unit further comprises:
   an internal bus coupled to said frequency generator;
   a microprocessor coupled to said internal bus;
   a memory coupled to said microprocessor;
   a voltmeter coupled to said internal bus;
   an ammeter coupled to said internal bus;
   a user interface coupled to said internal bus;
   an I/O interface coupled to said internal bus;
   an external bus coupled to said I/O interface;
   a variable power supply coupled to said internal bus; and
   a power supply coupled to said internal bus.

10. The ground fault detection and location system of claim 1 wherein said ground fault main unit further comprises:
    an internal bus coupled to said frequency generator;
    a microprocessor coupled to said internal bus;
    a memory coupled to said microprocessor;
    a voltmeter coupled to said internal bus;
    an ammeter coupled to said internal bus;
    a user interface coupled to said internal bus;
    an I/O interface coupled to said internal bus;
    an external bus coupled to said I/O interface;
    a variable power supply coupled to said internal bus; and
    a power supply coupled to said internal bus; and
    wherein said communication link comprises a cable connecting said ground fault main unit to said ground fault location apparatus; and
    wherein said current transformer is coupled to said ground fault location apparatus by a pair of probe leads.

11. The ground fault detection and location system of claim 10 further comprising a chart recorder coupled to said ground fault main unit, said chart recorder being configured to create a paper-based record of certain activities related to the operation of said ground fault main unit.

12. The ground fault detection and location system of claim 1 wherein said ground fault main unit further comprises a latch current selection dial, said latch current selection dial being configured to select a trigger current, wherein said trigger current is a current level above which the presence of a ground fault current will be of concern to an operator of said ground fault detection and location system.

13. The ground fault detection and location system of claim 1 wherein said ground fault main unit further comprises a latch LED, said latch LED being configured to indicate the presence of a ground fault current at or above a pre-selected level.

14. The ground fault detection and location system of claim 1 wherein said ground fault main unit further comprises:
    a latch LED, said latch LED being configured to indicate the presence of a ground fault current at a pre-selected level; and
    a latch current selection dial, said latch current selection dial being configured to select a trigger current, wherein said trigger current is a current level at or above which the presence of said ground fault current will be of concern to an operator of said ground fault detection and location system.

15. The ground fault detection and location system of claim 10 wherein said ground fault main unit further comprises:
    a latch LED, said latch LED being configured to indicate the presence of a ground fault current at a pre-selected level; and
    a latch current selection dial, said latch current selection dial being configured to select a trigger current, wherein said trigger current is a current level at or above which the presence of said ground fault current will be of concern to an operator of said ground fault detection and location system.

16. A method comprising the steps of:
    detecting a ground fault in a normally ungrounded circuit;
    generating an oscillating current in said normally ungrounded circuit, said oscillating current being oscillated at a target AC frequency;
    connecting a current transformer to a ground fault location apparatus, said ground fault location apparatus comprising:
      a bandpass filter coupled to a low-noise pre-amp;
      a bias floating ground coupled to said resonating capacitor and said bandpass filter;
      a diode coupled to said bias floating ground;
      a signal level display coupled to said diode;
      a comparator with hysterisis coupled to said bandpass filter;
      a low pass filter coupled to said bandpass filter and said comparator with hysterisis;
      an internal power supply; and
    a resonating capacitor coupled to said low-noise pre-amp, said resonating capacitor and said low-noise pre-amp being configured to amplify a current signal, thereby creating an amplified current signal; and
    monitoring said oscillating current with said current transformer and locating said ground fault by detecting said amplified current signal.

17. The method of claim 16 wherein said target AC frequency is a frequency in the range of 1 Hz-10 Hz.

18. The method of claim 16 wherein said target AC frequency is equal to 2 Hz.

* * * * *